United States Patent
Eakins et al.

(10) Patent No.: US 9,437,946 B2
(45) Date of Patent: Sep. 6, 2016

(54) PRINTED CIRCUIT BOARD ASSEMBLY HAVING IMPROVED TERMINALS

(71) Applicant: Lear Corporation, Southfield, MI (US)

(72) Inventors: Bert W. Eakins, Ortonville, MI (US); George E. Fox, Maybee, MI (US); Steven F. Gawron, Plymouth, MI (US)

(73) Assignee: LEAR CORPORATION, Southfield, MI (US)

( * ) Notice: Subject to any disclaimer, the term of this patent is extended or adjusted under 35 U.S.C. 154(b) by 0 days.

(21) Appl. No.: 14/573,195

(22) Filed: Dec. 17, 2014

(65) Prior Publication Data

US 2016/0181710 A1 Jun. 23, 2016

(51) Int. Cl.
| | |
|---|---|
| *H01R 12/58* | (2011.01) |
| *H05K 1/14* | (2006.01) |
| *H01R 43/20* | (2006.01) |
| *H01R 13/428* | (2006.01) |
| *H05K 1/18* | (2006.01) |

(52) U.S. Cl.
CPC .......... *H01R 12/585* (2013.01); *H01R 43/205* (2013.01); *H05K 1/14* (2013.01); *H01R 13/428* (2013.01); *H05K 1/18* (2013.01)

(58) Field of Classification Search
CPC .. H01R 13/05; H01R 13/422; H01R 13/428; H01R 9/226; H01R 5/0026; H01R 12/52; H01R 13/6595; H01R 43/0235; H01R 12/526; H01R 12/707; H01R 43/0256; H01R 12/585; H05K 5/0026; H05K 1/021; H05K 1/0212; H05K 1/0215; H05K 1/023; H05K 1/0231; H05K 1/0233; H05K 1/0234; H05K 1/0243; H05K 1/0295; H05K 1/14; H05K 1/141; H05K 1/142; H05K 1/144; H05K 1/145; H05K 1/16; H05K 1/162; H05K 1/165; H05K 1/182; H05K 1/183; H05K 1/184; H05K 1/185; H05K 2201/0317; H05K 2201/041; H05K 2201/049; H05K 2201/09763; H05K 2201/09872; H05K 2201/10446; H05K 2201/10454; H05K 2201/10462; H05K 2201/10469; H05K 2201/10477; H05K 2201/10492; H05K 2201/105; H05K 2201/10674; H05K 3/30; H05K 3/32; H05K 3/341; H05K 3/3415; H05K 3/3421; H05K 3/3431; H05K 3/36; H05K 3/46
USPC .......... 174/250–268; 361/752; 439/65, 76.2, 439/81, 82, 83, 751, 876, 947–949
See application file for complete search history.

(56) References Cited

U.S. PATENT DOCUMENTS

| | | | |
|---|---|---|---|
| 4,030,792 A | * | 6/1977 | Fuerst ................. H01R 12/585 439/629 |
| 4,797,112 A | | 1/1989 | Weisenburger |
| 5,980,307 A | | 11/1999 | Brewster et al. |
| 6,062,916 A | | 5/2000 | Gladd et al. |

(Continued)

*Primary Examiner* — Ishwarbhai B Patel
(74) *Attorney, Agent, or Firm* — MacMillan, Sobanski & Todd, LLC (57) ABSTRACT

A printed circuit board includes a surface and having first and second adjacent apertures. First and second electrical terminals include respective ends disposed in the first and second apertures of the printed circuit board, respective shoulders adjacent to the ends of the first and second electrical terminals and engaged with the surface of the printed circuit board, and respective insertion tabs adjacent to the shoulders of the first and second electrical terminals and located respective first and second distances away from the surface of the printed circuit board. The first and second distances are different such that the first and second insertion tabs do not touch one another.

12 Claims, 6 Drawing Sheets

(56) References Cited

U.S. PATENT DOCUMENTS

| | | |
|---|---|---|
| 6,790,051 B1 | 9/2004 | Secall et al. |
| 7,806,730 B2 | 10/2010 | Szczesny et al. |
| 7,957,156 B2 * | 6/2011 | Palomo ................ H01R 12/585 361/779 |
| 7,963,776 B1 * | 6/2011 | Morgan ................ H01R 12/52 174/262 |
| 8,758,041 B2 | 6/2014 | Bishop et al. |
| 2006/0178038 A1 | 8/2006 | Eakins et al. |

* cited by examiner

PRINTED CIRCUIT BOARD ASSEMBLY HAVING IMPROVED TERMINALS

BACKGROUND

This invention relates in general to printed circuit board (PCB) assemblies having a PCB and electrical terminals attached thereto. In particular, this invention relates to an improved electrical terminal for such a PCB assembly that facilitates more efficient and effective placement of a plurality of the improved electrical terminals on the PCB.

Such PCB assemblies may be found in a variety of applications, such as power-distribution systems or junction boxes that are used to manage power distribution in automotive vehicles. Junction boxes typically include housings and a printed circuit board with electrical terminals, fuses, relays, circuit breakers, and other electrical devices mounted thereto. Electrical devices, such as connectors and wiring harnesses, may be connected to the terminals through the housings.

The electrical terminals may include terminal blades, forked female terminals, and/or portions having any other desired shape, and combinations thereof, that extend from one or both surfaces of the PCB.

The terminals may include insertion tabs that extend substantially transversely from the terminal. Each insertion tab provides an engagement surface against which an insertion tool may engage and urge the terminal through an aperture in the PCB, thereby mounting the terminal to the PCB. The insertion tabs are typically flat and in the same plane as a body of the terminal.

A plurality of terminals may be mounted in line on the PCB such that the terminals are substantially co-planar. When adjacent terminals are mounted to the PCB in this manner, the insertion tabs may also be co-planar. Adjacent terminals are typically mounted with a minimum distance therebetween to ensure that the adjacent electronically conductive terminals do not touch each other and/or to provide space for a wall of a housing that may be mounted about each terminal. A minimum center line distance between adjacent terminals is thus determined by the size of the insertion tabs that extend substantially transversely from, and in the same plane as, the body of the terminal.

End users of conventional junction boxes however, may desire a reduced package size for the junction box, thus requiring smaller PCB assemblies within the smaller junction box. It is therefore desirable to provide a terminal design that allows adjacent terminals to be mounted closer together, thus reducing the center line distance between adjacent terminals and allowing the size of the PCB assembly and the package size of the junction box to be reduced.

SUMMARY OF THE INVENTION

This invention relates to an improved PCB assembly that allows adjacent terminals mounted to the PCB to be mounted closer together than is possible in conventional PCB assemblies. One embodiment of the PCB assembly includes a PCB and first and second electrical terminals mounted thereto. The first electrical terminal comprises a body having a first end and a second end, a mounting member extending outwardly from the first end configured for insertion into an aperture formed in the PCB, shoulders defined adjacent the mounting member, and a first insertion tab extending outwardly from the body at the first end thereof. The second electrical terminal is mounted adjacent the first electrical terminal and comprises a body having a first end and a second end, a mounting member extending outwardly from the first end configured for insertion into an aperture formed in the PCB, shoulders defined adjacent the mounting member, and a second insertion tab extending outwardly from the body at the first end thereof. The first insertion tab and the second insertion tab are axially spaced apart.

Various advantages of the invention will become apparent to those skilled in the art from the following detailed description, when read in view of the accompanying drawings.

DETAILED DESCRIPTION

The present invention will now be described with occasional reference to the specific embodiments of the invention. This invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 1:
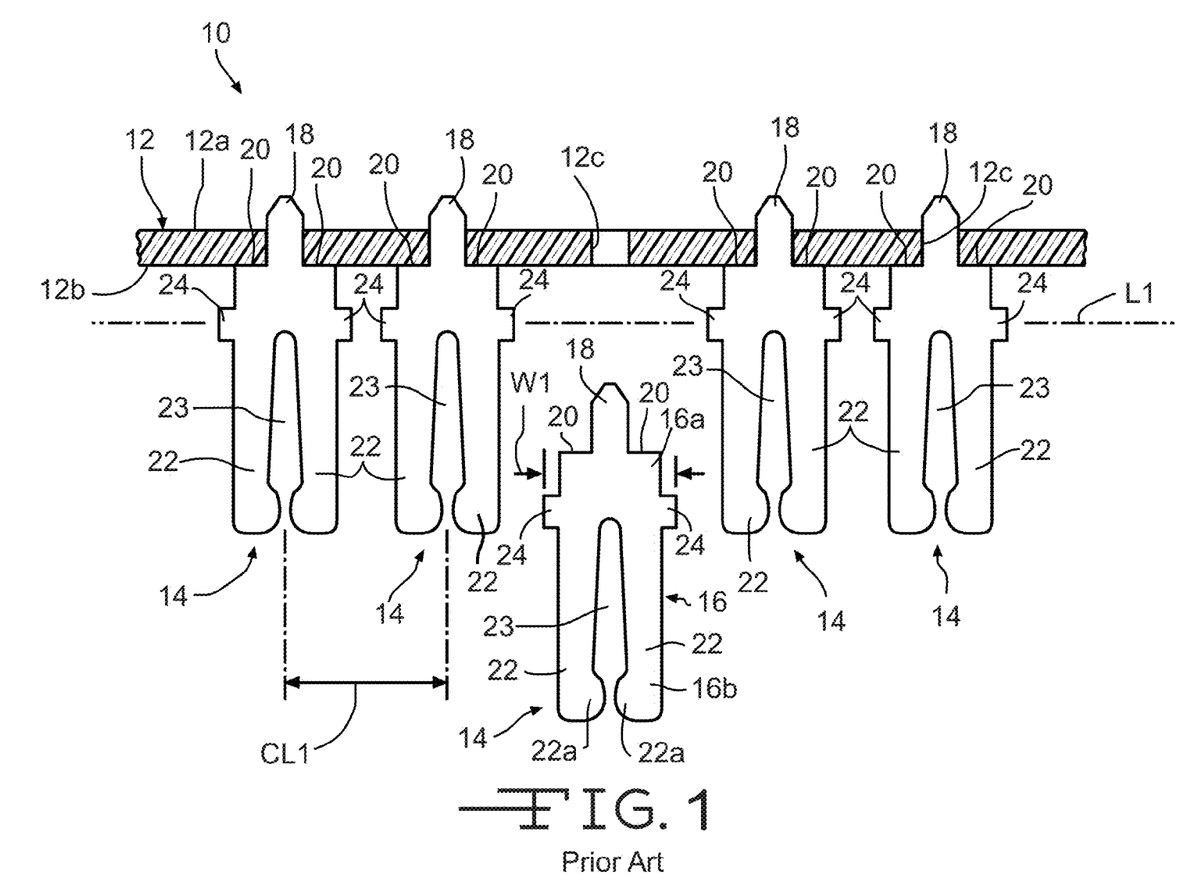
FIG. 1 is a cross sectional side elevational view of a portion of a known PCB assembly.

Referring now to FIG. 1, there is illustrated a portion of a conventional PCB assembly 10. The PCB assembly 10 illustrated in FIG. 1 includes a PCB 12 having a first major surface 12a (upper surface when viewing FIG. 1), a second major surface 12b (lower surface when viewing FIG. 1), and a plurality of tuning fork type electrical terminals 14. The terminals 14 are inserted in respective terminal apertures 12c formed through the PCB 12.

As shown in FIG. 1, each terminal 14 has a body 16 including a first end 16a and a second end 16b. The first end 16a has a mounting post 18 extending therefrom and defines shoulders 20 adjacent the mounting post 18. The mounting post 18 is configured for insertion and mounting within the apertures 12c of the PCB 12, and the shoulders 20 are configured to engage the second major surface 12b of the PCB 12.

The second end 16b is configured as a tuning fork type female terminal and includes two substantially parallel prongs 22 defining a slot 23 therebetween for receiving an electrical engagement feature, such as a terminal blade, of another electrical device (not shown). Connection protrusions or members 22a extend inwardly (into the slot 23) from the prongs 22 and are configured to provide an improved frictional fit of the terminal blade or other electrical engagement feature received in the slot 23.

Insertion tabs 24 extend outwardly from the terminal body 16 between the shoulders 20 and the tuning fork type female terminal 16b and are spaced a distance apart from the shoulders 20. In a known manner, the insertion tabs 24 extend substantially transversely from, and in the same plane as, the terminal body 16.

As shown in FIG. 1, the terminals 14 are identical. As a result, when they are mounted to the PCB 12, the insertions tabs 24 of adjacent terminals 14 are co-planar and aligned linearly along a line L1. Accordingly, a minimum centerline distance CL1 between adjacent terminals 14 is limited by the proximity of adjacent insertion tabs 24 to one another. For example, in the embodiment illustrated in FIG. 1, each of the terminals 14 has a width W1, measured from outside surfaces of the insertion tabs 24, of about 5.0 mm to about 5.2 mm. When mounted in a conventional manner as shown, the centerlines of adjacent terminals 14 are spaced apart by a distance CL1 of between about 6.5 mm and about 6.7 mm.

Referring now to FIGS. 4 through 9, there are illustrated alternative embodiments of electrical terminals, described in detail below, suitable for use in an improved PCB assembly 90, shown in FIGS. 2 and 3.

Figure 4:
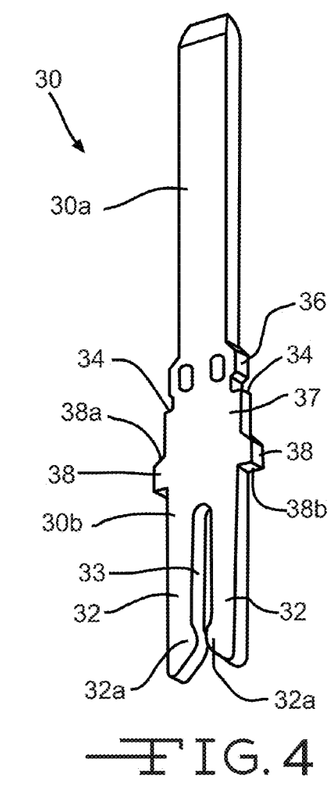
FIG. 4 is a perspective view of a first embodiment of an electrical terminal illustrated in FIG. 3.

Referring to FIG. 4, a first embodiment of an electrical terminal is shown at 30. The electrical terminal 30 includes a mounting member or first end 30a and a first embodiment of a second end 30b. The first end 30a is configured as a blade. The illustrated blade 30a has a width W2 between about 2.4 mm and about 2.6 mm.

The second end 30b is configured as a tuning fork type female terminal, similar to the tuning fork type female terminal 16b described above. The tuning fork type female terminal 30b includes two substantially parallel prongs 32 defining a slot 33 therebetween for receiving an electrical engagement feature, such as a terminal blade, of another electrical device (not shown). Connection protrusions or members 32a extend inwardly (into the slot 33) from the prongs 32 and are configured to provide an improved frictional fit of the terminal blade or other electrical engagement feature received in the slot 33.

Shoulders 34 are defined at an interface of the blade 30a and the tuning fork type female terminal 30b. The blade 30a is configured for insertion through the apertures 12c of the PCB 12, and the shoulders 34 are configured to engage the second major surface 12b of the PCB 12, as shown in FIG. 3 and described in detail below.

A mounting portion 36 may be formed at a proximal end of the blade 30a adjacent the second end 30b. As best shown in FIG. 3, the mounting portion 36 has a width W3 larger than the width W2 of the blade 30a. The illustrated mounting portion 36 has a width W3 between about 3.4 mm and about 3.6 mm. The mounting portion 36 is configured for insertion and mounting within the apertures 12c of the PCB 12. Alternatively, the terminal 30 may be formed without the mounting portion 36, if desired.

Insertion tabs 38 extend outwardly from the tuning fork type female terminal 30 between the shoulders 34 and the prongs 32, and include a first surface 38a and a second or tool-engagement surface 38b. The insertion tabs 38 are spaced a distance apart from the shoulders 34. In the embodiment illustrated, the first surface 38a is spaced between about 2.3 mm and about 2.5 mm from the shoulders 34. The electrical terminal 30 has the width W1, measured from outside surfaces of the insertion tabs 38 of about 5.0 mm to about 5.2 mm, as shown in FIG. 3.

Figure 3:
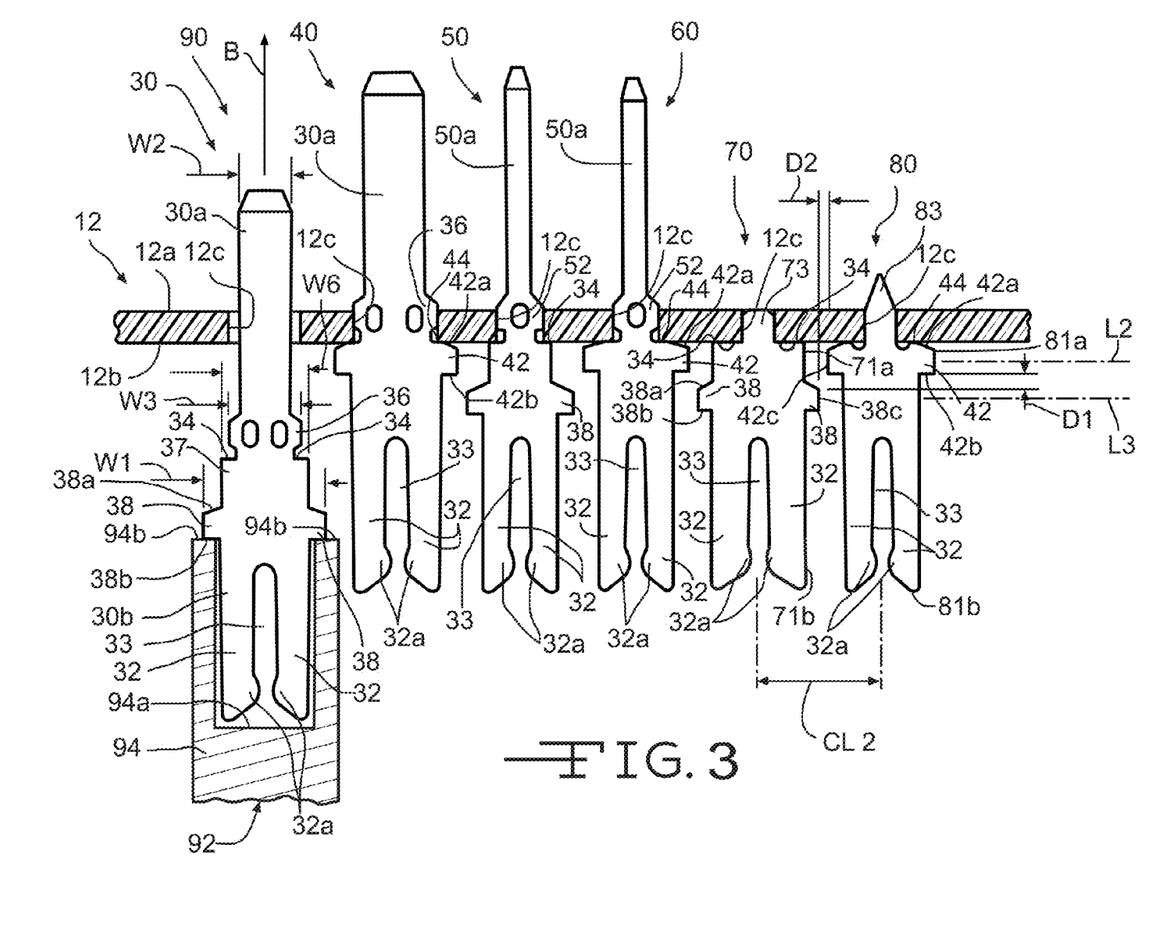
FIG. 3 is a cross sectional side elevational view of a portion of the improved PCB assembly illustrated in FIG. 2 shown subsequent to a second step of the first embodiment of a method of assembling the improved PCB assembly.

A portion 37 of the tuning fork type female terminal 30b between the insertion tabs 38 and the shoulders 34 has a width W6 between about 3.9 mm and about 4.1 mm, as also shown in FIG. 3.

The dimensions of the electrical terminal 30, including the blade 30a and the tuning fork type female terminal 30b described above are not limited to the dimensions disclosed and may have any other desired dimensions.

Figure 5:
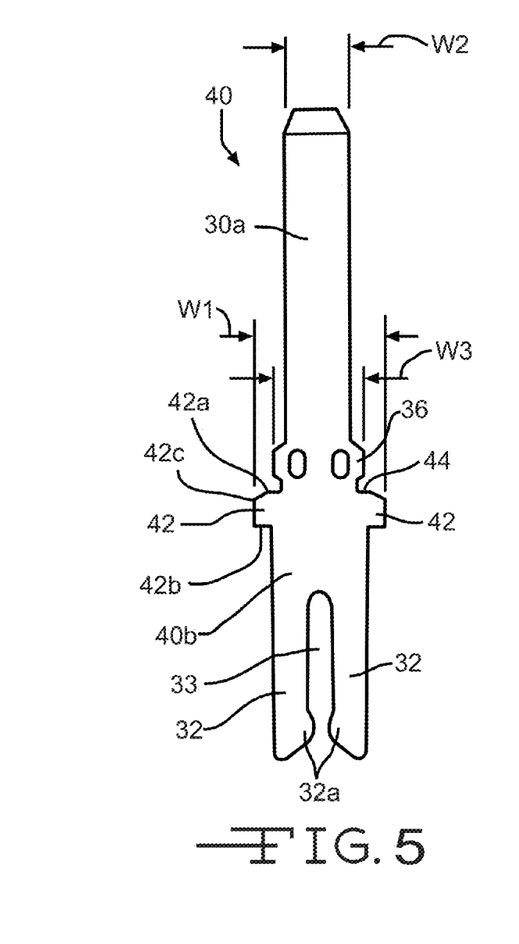
FIG. 5 is a side elevational view of a second embodiment of an electrical terminal illustrated in FIGS. 2 and 3.

Referring to FIG. 5, a second embodiment of an electrical terminal is shown at 40. The electrical terminal 40 is similar to the electrical terminal 30 and includes the first end 30a configured as the blade and a second embodiment of the second end 40b.

The second end 40b is configured as a tuning fork type female terminal, and includes the two substantially parallel prongs 32 defining the slot 33 therebetween. The connection protrusions or members 32a extend inwardly (into the slot 33) from the prongs 32.

In the tuning fork type female terminal 40b, insertion tabs 42 are provided that are substantially identical to the insertion tabs 38, including a first surface 42a and a second or tool-engagement surface 42b, but extending outwardly from the tuning fork type female terminal 40b at the interface of the blade 30a and the tuning fork type female terminal 40b. Thus, the first surfaces 42a of the insertion tabs 42 define shoulders 44.

The electrical terminal 40 has the width W1 measured from the outside surfaces of the insertion tabs 42, of about 5.0 mm to about 5.2 mm, as shown in FIG. 5.

The mounting portion 36 is formed between the blade 30a and the first surface 42a of the insertion tabs 42. As described above, the mounting portion 36 has a width W3 larger than the width W2 of the blade 30a.

The dimensions of the electrical terminal 40, including the blade 30a and the tuning fork type female terminal 40b described above, are not limited to the dimensions disclosed and may have any other desired dimensions.

Figure 6:
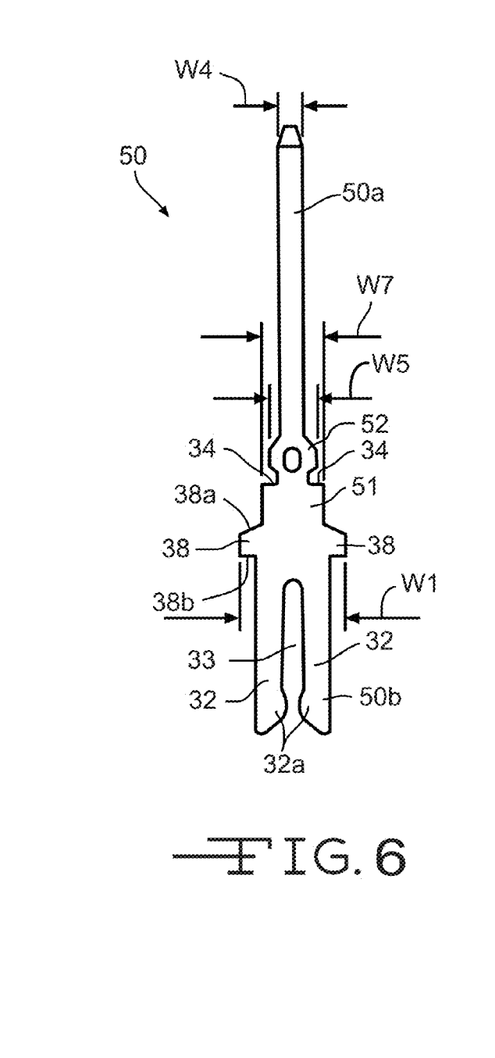
FIG. 6 is a side elevational view of a third embodiment of an electrical terminal illustrated in FIG. 3.

Referring to FIG. 6, a third embodiment of an electrical terminal is shown at 50. The electrical terminal 50 is similar to the electrical terminal 30 and includes a first end configured as a blade 50a and a third embodiment of the second end 50b. The illustrated blade 50a has a width W4 between about 1.1 mm and about 1.3 mm.

The third embodiment of the second end 50b is configured as a tuning fork type female terminal, and is substantially similar to the first embodiment of the tuning fork type female terminal 30b, except that a portion 51 of the tuning fork type female terminal 50b between the insertion tabs 38 and the shoulders 34 has a width W7 between about 2.9 mm and about 3.1 mm. The tuning fork type female terminal 50b includes the two substantially parallel prongs 32 defining the slot 33 therebetween and the connection members 32a, as described in detail above.

The electrical terminal 50 also includes a mounting portion 52 formed between the blade 50a and the tuning fork type female terminal 50b. The mounting portion 52 has a width W5 larger than the width W4 of the blade 50a. The illustrated mounting portion 52 has a width W5 between about 2.2 mm and about 2.4 mm, and is configured for insertion and mounting within the apertures 12c of the PCB 12.

The insertion tabs 38 extend outwardly from the tuning fork type female terminal 50b between the shoulders 34 and the prongs 32 and include the first surface 38a and the second or tool-engagement surface 38b. In the embodiment illustrated, the first surface 38*a* is spaced between about 2.3 mm and about 2.5 mm from the shoulders 34. The electrical terminal 50 has the width W1, measured from outside surfaces of the insertion tabs 38, of about 5.0 mm to about 5.2 mm.

The dimensions of the electrical terminal 50, including the blade 50*a* and the tuning fork type female terminal 50*b* described above, are not limited to the dimensions disclosed and may have any other desired dimensions.

Figure 7:
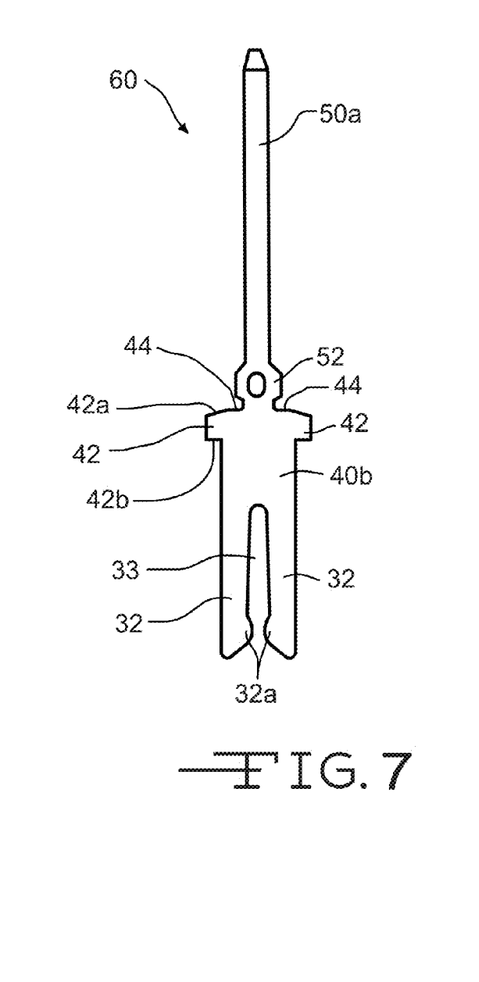
FIG. 7 is a side elevational view of a fourth embodiment of an electrical terminal illustrated in FIGS. 2 and 3.

Referring to FIG. 7, a fourth embodiment of an electrical terminal is shown at 60. The electrical terminal 60 is similar to the electrical terminal 50 and includes the first end configured as the blade 50*a* having the width W4, the mounting portion 52 having the width W5, the tuning fork type female terminal 40*b*, and the insertion tabs 42.

The tuning fork type female terminal 40*b* includes the two substantially parallel prongs 32 defining the slot 33 therebetween. Each prong 32 includes the connection protrusion or member 32*a*. The insertion tabs 42 include the first surface 42*a* and the second or tool-engagement surface 42*b*, wherein the first surfaces 42*a* define the shoulders 44.

Figure 8:
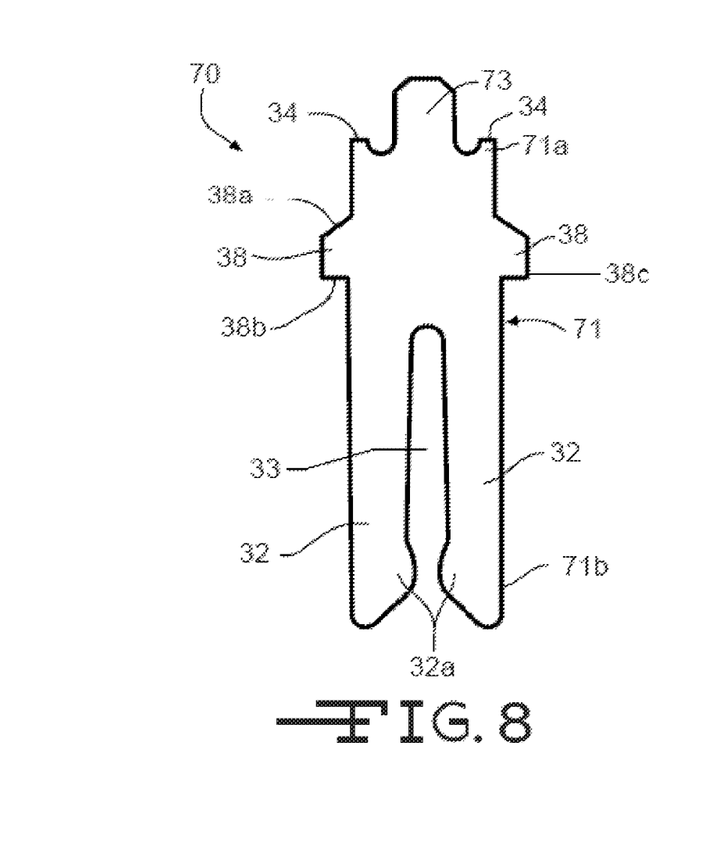
FIG. 8 is a side elevational view of a fifth embodiment of an electrical terminal illustrated in FIG. 3.

Referring to FIG. 8, a fifth embodiment of an electrical terminal is shown at 70. The electrical terminal 70 includes a body 71 having a first end 71*a* and a second end 71*b*. The first end 71*a* has a mounting post 73 extending therefrom and defines the shoulders 34 adjacent the mounting post 73. The body 71 is similar to the second end 30*b* and includes the two substantially parallel prongs 32 defining the slot 33 therebetween. Each prong 32 includes the connection protrusion or member 32*a*. The body 71 further includes the insertion tabs 38 extending outwardly from the body 71 between the shoulders 34 and the prongs 32. Each insertion tabs 38 includes the first surface 38*a* and the second or tool-engagement surface 38*b*. The insertion tabs 38 are spaced a distance apart from the shoulders 34. In the embodiment illustrated, the first surface 38*a* is spaced between about 2.3 mm and about 2.5 mm from the shoulders 34.

Figure 9:
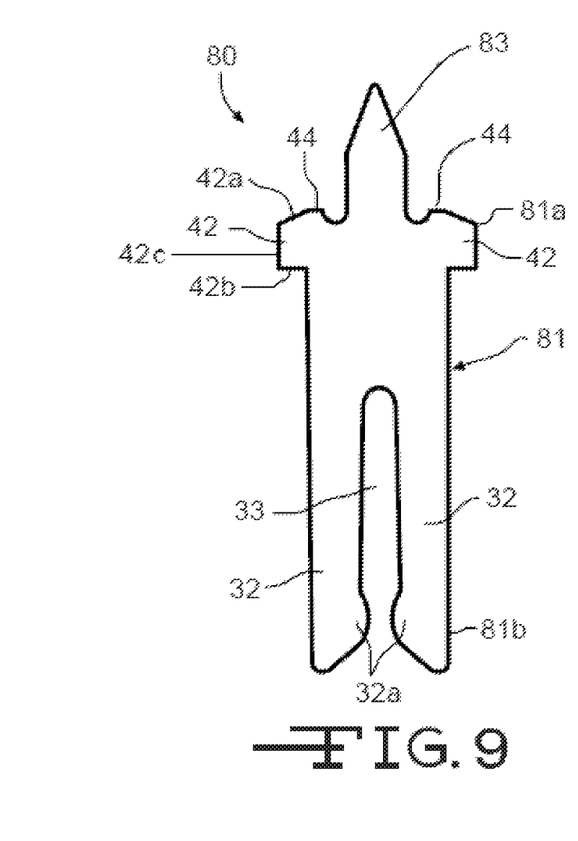
FIG. 9 is a side elevational view of a sixth embodiment of an electrical terminal illustrated in FIGS. 2 and 3.

Referring to FIG. 9, a sixth embodiment of an electrical terminal is shown at 80. The electrical terminal 80 includes a body 81 having first end 81*a* and a second end 81*b*. The first end 81*a* has a mounting post 83 extending therefrom. The body 81 is similar to the second end 40*b* and includes the two substantially parallel prongs 32 defining the slot 33 therebetween. Each prong 32 includes the connection protrusion or member 32*a*. The body 81 further includes the insertion tabs 42 extending outwardly from the body 81 at the first end 81*a* thereof and include the first surface 42*a* and the second or tool-engagement surface 42*b*, wherein the first surface 42*a* of the insertion tabs 42 defines the shoulders 44.

The dimensions of the electrical terminals 70 and 80, including the component parts thereof, described above are not limited to the dimensions disclosed, and may have any other desired dimensions.

The illustrated mounting post 83 has a tapered distal end. It will be understood that the terminals 70 and 80 may have the mounting post 73, as shown in FIG. 8, or the tapered mounting post 83, as shown in FIG. 9.

As described above, the electrical terminals 40, 60, and 80 are similar in that the insertion tabs 42 define the shoulders 44. Similarly, the electrical terminals 30, 50, and 70 are similar in that the insertion tabs 38 are equidistant from the shoulders 34, and therefore equidistant from the second major surface 12*b* of the PCB 12.

It will be understood that the insertion tabs 42 on the electrical terminals 40, 60, and the insertion tabs 38 on the electrical terminals 30, 50, and 70 may be formed at any desired axial location, such that when assembled in a PCB assembly, such as shown at 90 in FIG. 3, each insertion tab 38 may be axially spaced apart from an adjacent insertion tab 42 a distance D1 for reasons described below. In the illustrated embodiment, the distance D1 is about 0.5 mm. Alternatively, the distance D1 may be any desired distance, including a distance less than about 0.5 mm and a distance greater than about 0.5 mm.

Figure 2:
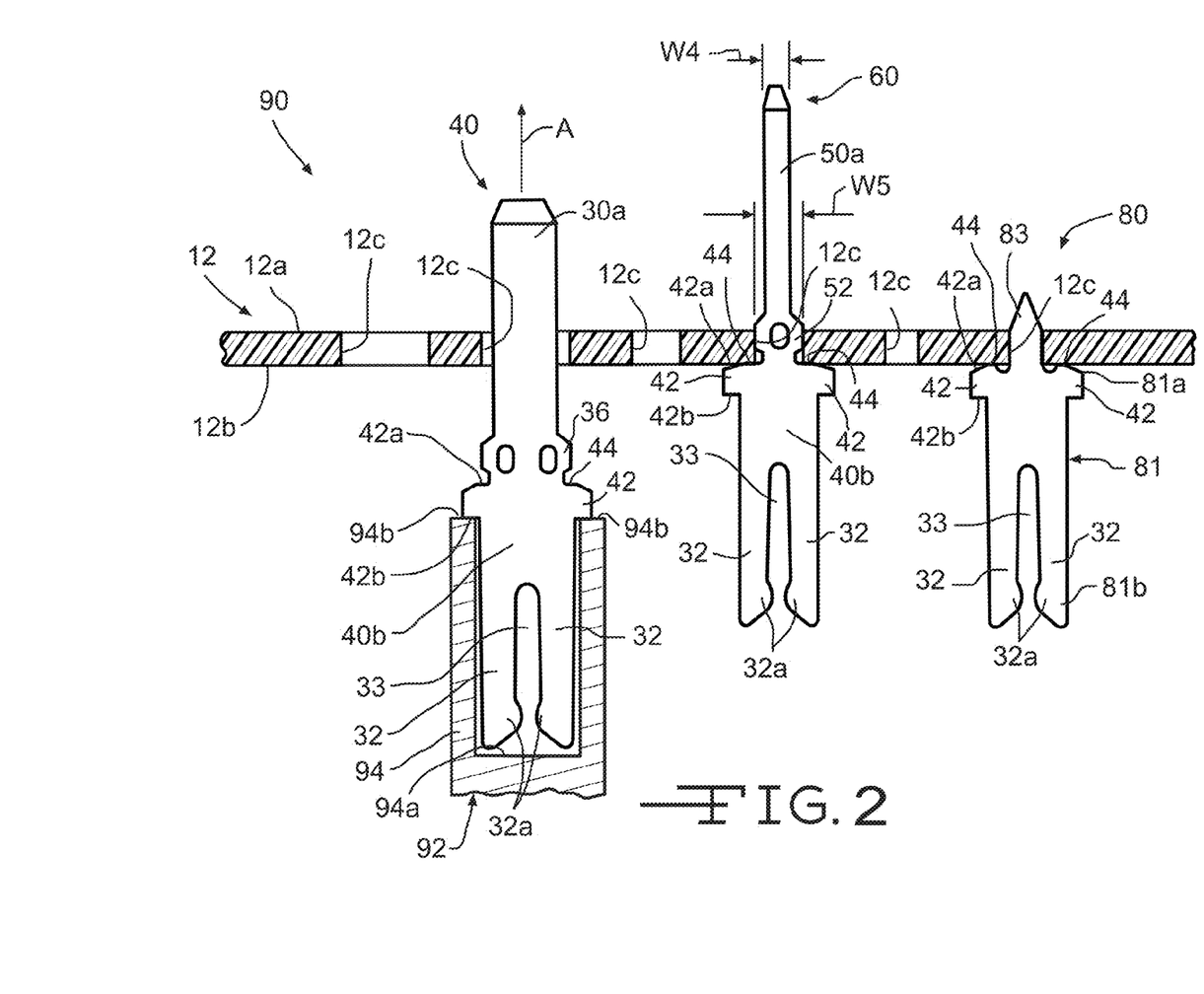
FIG. 2 is a cross sectional side elevational view of a portion of an improved PCB assembly according to the invention shown subsequent to a first step of a first embodiment of a method assembling the improved PCB assembly.

Referring now to FIGS. 2 and 3, there is illustrated at 90 an improved PCB assembly shown during first and second steps, respectively, of a method of assembling the improved PCB assembly 90 in accordance with the invention.

As shown in FIG. 2, an insertion tool 92 includes a body 94 having a cavity 94*a*, which is configured to receive the tuning fork type female terminal 40*b*, and a terminal-engagement surfaces 94*b*. The tool 92 is disposed about the tuning fork type female terminal 40*b* of the terminal 40 such that the terminal-engagement surfaces 94*b* engage the tool-engagement surfaces 42*b* of the insertion tabs 42. A force is applied to the tool 92 in the direction of the arrow A, urging the blade 30*a* into the aperture 12*c* until the shoulders 44 engage, and are seated against, the second major surface 12*b*, thereby mounting the terminal 40 to the PCB 12. Solder (not shown) may then be applied to the terminal 40 on one or both of the first and second major surfaces 12*a* and 12*b*, respectively, to provide an electrical connection therebetween.

In FIG. 2, the terminals 60 and 80 are shown subsequent to being assembled in the same manner as the terminal 40. Although the tool-engagement surface 42*b* of the terminal 40 is shown as the second surface of the insertion tabs 42, the terminals 40, 60, and 80 may be configured such that the tool-engagement surface 42*b* is defined on any desired portion of the terminals 40, 60, and 80. Similarly, the tool 92 may be configured such that the terminal-engagement surfaces 94*b* are defined on any desired portion of the tool 92 that engage the terminals 40, 60, and 80 and allow the terminals 40, 60, and 80 to be urged through the apertures 12*c* and into contact with the second major surface 12*b* of the PCB 12. Each terminal 60 and 80 may also be mounted to the PCB 12 in the same manner as the terminal 40, wherein the blade 50*a* or the mounting post 83 is urged into an aperture 12*c* of the PCB 12.

As shown in FIG. 3, the insertion tool 92 is disposed about the tuning fork type female terminal 30*b* of the terminal 30, such that the terminal-engagement surfaces 94*b* engage the tool-engagement surfaces 38*b* of the insertion tabs 38. A force is applied to the tool 92 in the direction of the arrow B, urging the blade 30*a* into the aperture 12*c* until the shoulders 34 engage, and are seated against, the second major surface 12*b*. Solder (not shown) may then be applied to the terminal 30 on one or both of the first and second major surfaces 12*a* and 12*b*, respectively, to provide an electrical connection therebetween.

Each terminal 50 and 70 may also be mounted to the PCB 12 in the same manner as the terminal 30, wherein the blade 50*a* or the mounting post 73 is urged into an aperture 12*c* of the PCB 12. In FIG. 3, the terminals 50 and 70 are shown subsequent to being assembled in the same manner as the terminal 30.

As further shown in FIG. 3, when mounted to the PCB 12, the insertion tabs 42 of the terminals 40, 60, and 80 are co-planar and aligned linearly along a line L2. Similarly, when mounted to the PCB 12, the insertion tabs 38 of the terminals 30, 50, and 70 are co-planar and aligned linearly along a line L3. In the illustrated embodiment, the terminals are mounted such that any one of the terminals 30, 50, and 70 are mounted in an alternating manner with any one of the terminals 40, 60, and 80. This arrangement ensures that a terminal with the insertion tabs 38 is adjacent a terminal with the insertion tabs 42.

As shown in FIG. 3, the insertion tabs 42 of the terminals 40, 60, and 80 and the insertion tabs 38 of the terminals 30, 50, and 70 are axially spaced apart the distance D1. This axial spacing allows adjacent terminals to be mounted more closely together than is possible in conventional PCB assemblies, such as the PCB assembly 10 shown in FIG. 1. Accordingly, a minimum centerline distance CL2 between any two adjacent terminals illustrated in FIG. 3 may be smaller than the centerline distance between terminals in conventional PCB assemblies, such as the PCB assembly 10 illustrated in FIG. 1. For example, in the exemplary embodiment illustrated in FIG. 3, the centerline distance CL2 is between about 5.0 mm and about 5.2 mm. Alternatively, the centerline distance CL2 may be any desired distance, including a distance less than about 5.0 mm and a distance greater than about 5.2 mm.

In the illustrated embodiment, adjacent terminals are transversely spaced apart such that an outside surface 38c (a representative example of which is shown in the terminal 70 in FIG. 3) of the insertion tabs 38 may be spaced apart a distance D2 from an outside surface 42c (a representative example of which is shown in the terminal 80 in FIG. 3) of the insertion tabs 42. In the illustrated embodiment, the distance D2 is about 0.5 mm. Alternatively, the distance D2 may be any desired distance, including a distance less than about 0.5 mm and a distance greater than about 0.5 mm.

As in a conventional PCB assembly, the electrically conductive terminals of the improved PCB assembly 90 may not contact one another. It will be understood that any two terminals (30, 40, 50, 60, 70, and 80) of the improved PCB assembly 90 may be arranged in any position relative to one another such that they do not touch one another.

For example, adjacent terminals may be mounted such that their corresponding insertion tabs, 38 and 42, are positioned in an overlapping arrangement, but spaced apart a distance such that they do not touch one another.

Further, during assembly of the illustrated improved PCB assembly 90, the space created by the distance D2 between the outside surfaces 38c and the outside surfaces 42c allows for the insertion of the tool 92 in the space between adjacent terminals. The distance D2 between adjacent terminals also has the benefit of providing space for a portion of a non-conductive element, such as a wall of a connector body or of a junction box body, to be disposed and fixed therein between the adjacent terminals. It will be understood however, that the distance D2 need not be large enough to allow for the insertion of the tool 92 or for a portion of the non-conductive element.

The exemplary embodiments of the electrical terminals 30, 40, 50, 60, 70 and 80 illustrated in FIGS. 4 through 9 include first ends configured as blades and second ends configured as tuning fork type female terminals. It will be understood that the first ends of the electrical terminals 30, 40, 50, 60, 70 and 80 may have any design, shape or configuration suitable for use in a PCB. Similarly, the second ends of the electrical terminals 30, 40, 50, 60, 70 and 80 may have any design, shape or configuration suitable for use in a PCB and requiring one or more insertion tabs thereon.

Additionally, each of the exemplary embodiments of the electrical terminals 30, 40, 50, 60, 70 and 80 illustrated in FIGS. 4 through 9 include two insertion tabs formed thereon. It will be understood that the electrical terminals 30, 40, 50, 60, 70 and 80 may have any desired number of insertion tabs formed thereon, including having only one insertion tabs formed thereon.

The principle and mode of operation of the invention have been described in its preferred embodiments. However, it should be noted that the invention described herein may be practiced otherwise than as specifically illustrated and described without departing from its scope.

What is claimed is:

1. A printed circuit board assembly comprising:
   a printed circuit board including a surface and having first and second adjacent apertures extending through the surface;
   a first electrical terminal including an end that is disposed in the first aperture of the printed circuit board, a shoulder that is adjacent to the end of the first electrical terminal and engaged with the surface of the printed circuit board, and an insertion tab that is adjacent to the shoulder of the first electrical terminal and located a first distance away from the surface of the printed circuit board; and
   a second electrical terminal including an end that is disposed in the second aperture of the printed circuit board, a shoulder that is adjacent to the end of the second electrical terminal and engaged with the surface of the printed circuit board, and an insertion tab that is adjacent to the shoulder of the second electrical terminal and located a second distance away from the surface of the printed circuit board;
   wherein the first and second distances are sufficiently different such that the first and second insertion tabs do not touch one another.

2. The printed circuit board assembly defined in claim 1 wherein the insertion tab of the first electrical terminal is co-planar with the insertion tab of the second electrical terminal.

3. The printed circuit board assembly defined in claim 1 wherein the shoulder that is adjacent to the end of the first electrical terminal is provided on the insertion tab of the first electrical terminal.

4. The printed circuit board assembly defined in claim 1 wherein the first electrical terminal includes opposed insertion tabs that are adjacent to the shoulder of the first electrical terminal and located the first distance away from the surface of the printed circuit board.

5. The printed circuit board assembly defined in claim 4 wherein the second electrical terminal includes opposed insertion tabs that are adjacent to the shoulder of the second electrical terminal and located the second distance away from the surface of the printed circuit board.

6. The printed circuit board assembly defined in claim 1 wherein the first and second insertion tabs are positioned in an overlapping arrangement.

7. The printed circuit board assembly defined in claim 1 wherein the printed circuit board has a third aperture extending through the surface adjacent to the second aperture, and further including a third electrical terminal including an end that is disposed in the third aperture of the printed circuit board, a shoulder that is adjacent to the end of the third electrical terminal and engaged with the surface of the printed circuit board, and an insertion tab that is adjacent to the shoulder of the third electrical terminal and located the first distance away from the surface of the printed circuit board, wherein the second and third insertion tabs do not touch one another.

8. The printed circuit board assembly defined in claim 7 wherein (1) the shoulder that is adjacent to the end of the first electrical terminal is provided on the insertion tab of the first electrical terminal, and (2) the shoulder that is adjacent to the end of the third electrical terminal is provided on the insertion tab of the third electrical terminal.

9. The printed circuit board assembly defined in claim 7 wherein (1) the first electrical terminal includes opposed insertion tabs that are adjacent to the shoulder of the first electrical terminal and located the first distance away from the surface of the printed circuit board, and (2) the third electrical terminal includes opposed insertion tabs that are adjacent to the shoulder of the third electrical terminal and located the first distance away from the surface of the printed circuit board.

10. The printed circuit board assembly defined in claim 9 wherein the second electrical terminal includes opposed insertion tabs that are adjacent to the shoulder of the second electrical terminal and located the second distance away from the surface of the printed circuit board.

11. The printed circuit board assembly defined in claim 7 wherein the first, second, and third insertion tabs are positioned in an overlapping arrangement.

12. The printed circuit board assembly defined in claim 1 wherein the insertion tab of the first electrical terminal is co-planar with both the insertion tab of the second electrical terminal and the insertion tab of the third electrical terminal.

* * * * *